(12) United States Patent
Shah et al.

(10) Patent No.: US 10,937,755 B2
(45) Date of Patent: Mar. 2, 2021

(54) BOND PADS FOR LOW TEMPERATURE HYBRID BONDING

(71) Applicant: ADVANCED MICRO DEVICES, INC., Santa Clara, CA (US)

(72) Inventors: Priyal Shah, San Jose, CA (US); Milind S. Bhagavat, Los Altos, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/023,399

(22) Filed: Jun. 29, 2018

(65) Prior Publication Data
US 2020/0006280 A1 Jan. 2, 2020

(51) Int. Cl.
H01L 23/00 (2006.01)

(52) U.S. Cl.
CPC ............ *H01L 24/80* (2013.01); *H01L 24/03* (2013.01); *H01L 24/05* (2013.01); *H01L 24/06* (2013.01); *H01L 24/08* (2013.01); *H01L 2224/0384* (2013.01); *H01L 2224/05082* (2013.01); *H01L 2224/05118* (2013.01); *H01L 2224/05124* (2013.01); *H01L 2224/05166* (2013.01); *H01L 2224/05184* (2013.01); *H01L 2224/05186* (2013.01); *H01L 2224/05557* (2013.01); *H01L 2224/05647* (2013.01); *H01L 2224/05655* (2013.01); *H01L 2224/0603* (2013.01); *H01L 2224/0614* (2013.01); *H01L 2224/06515* (2013.01); *H01L 2224/08146* (2013.01); *H01L 2224/8034* (2013.01);
(Continued)

(58) Field of Classification Search
CPC combination set(s) only.
See application file for complete search history.

(56) References Cited

U.S. PATENT DOCUMENTS

| 5,901,041 A | 5/1999 | Davies et al. |
| 6,589,802 B1 | 7/2003 | Asada et al. |
| 6,977,686 B2 | 12/2005 | Shinomiya et al. |

(Continued)

FOREIGN PATENT DOCUMENTS

| JP | 05160296 | 6/1993 |
| JP | 11265909 | 9/1999 |

(Continued)

OTHER PUBLICATIONS

PCT/US2011/051075 International Search Report dated Dec. 27, 2011.

(Continued)

*Primary Examiner* — Nduka E Ojeh

(57) ABSTRACT

Various chip stacks and methods and structures of interconnecting the same are disclosed. In one aspect, an apparatus is provided that includes a first semiconductor chip that has a first glass layer and plural first groups of plural conductor pads in the first glass layer. Each of the plural first groups of conductor pads is configured to bumplessly connect to a corresponding second group of plural conductor pads of a second semiconductor chip to make up a first interconnect of a plurality interconnects that connect the first semiconductor chip to the second semiconductor chip. The first glass layer is configured to bond to a second glass layer of the second semiconductor chip.

16 Claims, 15 Drawing Sheets

(52) U.S. Cl.
CPC .......... *H01L 2224/8089* (2013.01); *H01L 2224/80801* (2013.01); *H01L 2224/80906* (2013.01)

(56) References Cited

U.S. PATENT DOCUMENTS

| | | | |
|---|---|---|---|
| 7,198,980 B2 | 4/2007 | Jiang et al. | |
| 7,915,720 B2 | 3/2011 | Tashiro et al. | |
| 8,372,741 B1 | 2/2013 | Co et al. | |
| 8,691,626 B2 | 4/2014 | Su et al. | |
| 8,842,945 B2 | 9/2014 | Nguyen et al. | |
| 9,214,454 B2 | 12/2015 | Haba et al. | |
| 9,312,198 B2 | 4/2016 | Meyer et al. | |
| 9,502,390 B2 | 11/2016 | Caskey et al. | |
| 9,520,333 B1 | 12/2016 | Shih et al. | |
| 9,601,461 B2 | 3/2017 | Ho et al. | |
| 9,620,464 B2 | 4/2017 | Baks et al. | |
| 9,768,105 B2 | 9/2017 | Lii et al. | |
| 9,780,079 B2 | 10/2017 | Li et al. | |
| 9,806,014 B2 | 10/2017 | Alfano et al. | |
| 9,812,429 B2 | 11/2017 | Das et al. | |
| 9,818,697 B2 | 11/2017 | Lin et al. | |
| 9,859,191 B2 | 1/2018 | Lee et al. | |
| 9,893,036 B2 | 2/2018 | Ogiso et al. | |
| 9,966,325 B2 | 5/2018 | Beyne | |
| 9,972,611 B2 | 5/2018 | Pappu et al. | |
| 2001/0050441 A1 | 12/2001 | Shivkumar et al. | |
| 2003/0209837 A1 | 11/2003 | Farnworth | |
| 2004/0124513 A1 | 7/2004 | Ho et al. | |
| 2005/0167798 A1 | 8/2005 | Doan | |
| 2006/0207789 A1 | 9/2006 | Soeta | |
| 2007/0205501 A1 | 9/2007 | Lee et al. | |
| 2008/0081401 A1 | 4/2008 | Shizuno | |
| 2013/0009321 A1* | 1/2013 | Kagawa | H01L 21/76807 257/774 |
| 2013/0020704 A1* | 1/2013 | Sadaka | H01L 23/3178 257/741 |
| 2013/0320556 A1* | 12/2013 | Liu | H01L 24/08 257/774 |
| 2013/0334691 A1* | 12/2013 | Farooq | H05K 3/423 257/751 |
| 2015/0311182 A1 | 10/2015 | Lee et al. | |
| 2016/0351540 A1 | 12/2016 | Ogiso et al. | |
| 2018/0040592 A1 | 2/2018 | Gandhi et al. | |
| 2018/0130772 A1 | 5/2018 | Yu et al. | |
| 2019/0157333 A1* | 5/2019 | Tsai | H01L 24/08 |

FOREIGN PATENT DOCUMENTS

| | | |
|---|---|---|
| JP | 2000311905 | 11/2000 |
| JP | 2000357768 | 12/2000 |
| JP | 2009158623 | 7/2009 |

OTHER PUBLICATIONS

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.

* cited by examiner

BOND PADS FOR LOW TEMPERATURE HYBRID BONDING

BACKGROUND OF THE INVENTION

Many current integrated circuits are formed as multiple chips on a common wafer. After the basic process steps to form the circuits on the chips are complete, the individual chips are singulated from the wafer. The singulated chips are then usually mounted to structures, such as circuit boards, or packaged in some form of enclosure.

One frequently-used package consists of a substrate upon which a chip is mounted. The upper surface of the substrate includes electrical interconnects. The chip is manufactured with a plurality of bond pads. A collection of solder joints are provided between the bond pads of the chip and the substrate interconnects to establish ohmic contact. After the chip is mounted to the substrate, a lid is attached to the substrate to cover the chip. Some conventional integrated circuits, such as microprocessors, generate sizeable quantities of heat that must be transferred away to avoid device shutdown or damage. The lid serves as both a protective cover and a heat transfer pathway.

Stacked chips arrangements involve placing or stacking one or more semiconductor chips on a base semiconductor chip. In some conventional variants, the base semiconductor chip is a high heat dissipating device, such as a microprocessor. The stacked chips are sometimes memory devices. In a typical conventional manufacturing process the chips are stacked one at a time on the base chip. Chip-to-chip electrical connections are by way of bumps and through-chip-vias. Conventional microbumping involves pick and place, plating or stenciling microbumps followed by a solder reflow. A minimum bump pitch is necessary to avoid shorts.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
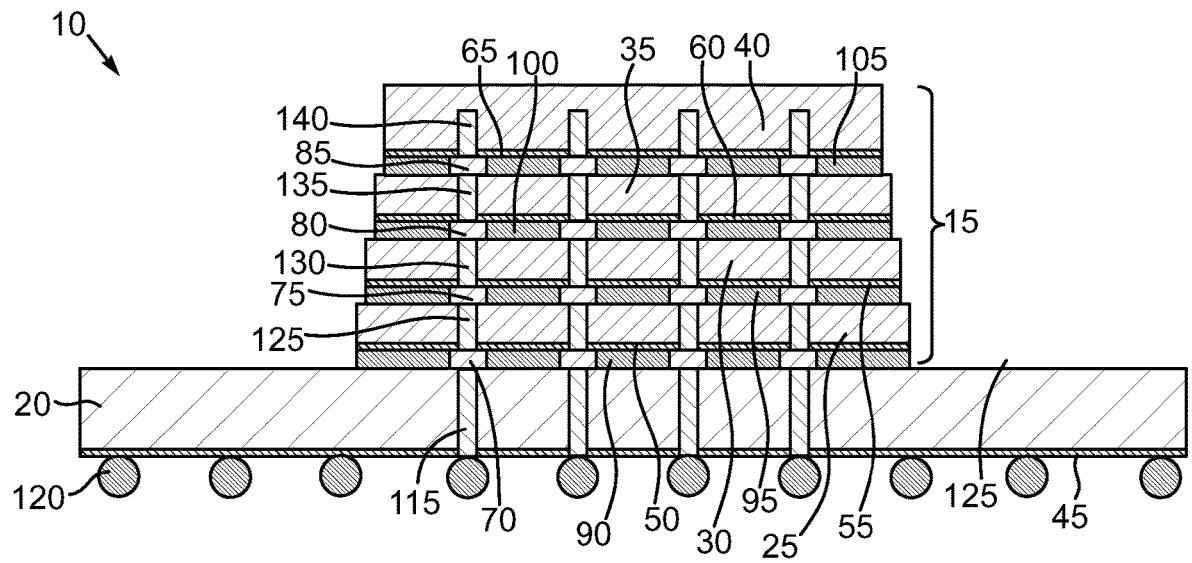
FIG. 1 is a sectional view of an exemplary arrangement of a semiconductor chip device with chip stacking.

A conventional chip stacking technique stacks chips sequentially, one chip on top of the first chip and so on up to the top chip of the stack. Where through-chip-vias (TCVs) are used for chip to chip electrical connections, a reveal process is necessary to reveal the TCVs of one chip before the next chip is mounted. Solder microbumping is a conventional technique to interconnect two stacked chips. Conventional microbumping requires fairly large bump pitches to avoid shorts, can produce high thermal resistance and require significant electrostatic discharge protection.

The disclosed structures and methods use bumpless hybrid bonding to interconnect two stacked semiconductor chips. There are various techniques and structures disclosed to enable the hybrid bonding process to be carried out at temperatures low enough to reduce the risk of damaging the circuit structures of the stacked chips. Techniques to reduce the effects of pad dishing, to enhance the coefficient of thermal expansion (CTE) of pads and to reduce the yield strength of pads, which can reduce bonding temperatures are disclosed.

In accordance with one aspect of the present invention, an apparatus is provided that includes a first semiconductor chip that has a first glass layer and plural first groups of plural conductor pads in the first glass layer. Each of the plural first groups of conductor pads is configured to bumplessly connect to a corresponding second group of plural conductor pads of a second semiconductor chip to make up a first interconnect of a plurality interconnects that connect the first semiconductor chip to the second semiconductor chip. The first glass layer is configured to bond to a second glass layer of the second semiconductor chip.

In accordance with another aspect of the present invention, an apparatus is provided that includes a first semiconductor chip that has a first glass layer and plural first conductor pads in the first glass layer. Each of the plural first conductor pads includes a base layer and a bonding layer on the base layer. The base layer has a greater coefficient of thermal expansion than the bonding layer. The bonding layer is configured to bumplessly bond to a conductor pad of another semiconductor chip. The first glass layer is configured to bond to a second glass layer of the second semiconductor chip.

In accordance with another aspect of the present invention, a method of manufacturing is provided that includes fabricating plural first groups of plural conductor pads in a first glass layer of a first semiconductor chip. Each of the plural first groups of conductor pads is configured to bumplessly connect to a corresponding second group of plural conductor pads of a second semiconductor chip to make up a first interconnect of a plurality interconnects that connect the first semiconductor chip to the second semiconductor chip. The first glass layer is configured to bond to a second glass layer of the second semiconductor chip.

In accordance with another aspect of the present invention, a method of manufacturing is provided that includes fabricating plural first conductor pads in a first glass layer of a first semiconductor chip. Each of the plural first conductor pads includes a base layer and a bonding layer on the base layer. The base layer has a greater coefficient of thermal expansion than the bonding layer. The bonding layer is configured to bumplessly bond to a conductor pad of another semiconductor chip. The first glass layer is configured to bond to a second glass layer of the second semiconductor chip.

In accordance with another aspect of the present invention, a method of manufacturing is provided that includes fabricating first conductor pads in a first glass layer of a first semiconductor chip, planarizing the first glass layer by chemical mechanical polishing, and planarizing the first glass layer and the first conductor pads by machining. The first conductor pads are configured to bumplessly connect to corresponding plural conductor pads of a second semiconductor chip to make up a plurality of interconnects that connect the first semiconductor chip to the second semiconductor chip. The first glass layer is treated to render it hydrophillic to facilitate bonding to a second glass layer of the second semiconductor chip.

In accordance with another aspect of the present invention, a method of manufacturing is provided that includes fabricating plural first conductor pads in a first glass layer of a first semiconductor chip. The first glass layer is configured to bond to a second glass layer of the second semiconductor chip. Each of the plural first conductor pads has a first average grain size and is configured to bumplessly connect to a corresponding second group of plural conductor pads of a second semiconductor chip to make up a plurality of interconnects that connect the first semiconductor chip to the second semiconductor chip. The first semiconductor chip is annealed to increase the grain size to a second average grain size and thereby reduce the yield strength of the first conductor pads.

In the drawings described below, reference numerals are generally repeated where identical elements appear in more than one figure. Turning now to the drawings, and in particular to FIG. 1 which is a sectional view of an exemplary semiconductor chip device 10 that includes a stack 15 of multiple semiconductor chips mounted on another semiconductor chip 20. The semiconductor chip device 10 can be mounted on a circuit board (not shown), such as a package substrate, a system board, a daughter board, circuit cards or other. The stack 15 in this illustrative arrangement consists of four semiconductor chips 25, 30, 35 and 40, but of course, other numbers are possible. The semiconductor chips 20, 25, 30, 35 and 40 include respective back end of line structures (BEOL) 45, 50, 55, 60 and 65. The BEOLs 45, 50, 55, 60 and 65 consist of strata of logic and other devices that make up the functionalities of the semiconductor chips 20, 25, 30, 35 and 40 as well as plural metallization and interlevel dielectric layers. The semiconductor chips 25, 30, 35 and 40 of the semiconductor chip stack 15 can have different footprints or approximately the same footprint. In the illustrated arrangement, the semiconductor chips 25, 30, 35 and 40 of the semiconductor chip stack 15 can have successively smaller footprints, that is, the semiconductor chip 40 is smaller than the semiconductor chip 35, which in-turn is smaller than the semiconductor chip 30 and so on. However, it should be understood that other combinations of one or multiple footprints could be used.

Electrical connections between the semiconductor chip 25 and the semiconductor chip 20 are by way of plural interconnects 70. The semiconductor chip 30 is electrically connected to the semiconductor chip 25 by way of plural interconnects 75. In addition, sets of interconnects 80 and 85 establish electrical conductivity between the semiconductor chips 35 and 30 and 40 and 35, respectively. Insulating layers 90, 95, 100 and 105 are positioned between the semiconductor chip 25 and semiconductor chip 20, the semiconductor chip 30 and the semiconductor chip 25, the semiconductor chip 35 and the semiconductor chip 30 and the semiconductor chip 40 and the semiconductor chip 35, respectively. The insulating layers 90, 95, 100 and 105 can be unitary or multiple layer structures as described in more detail below. The interconnects 70, 75, 80 and 85 are preferably bumpless glass hybrid bond interconnects. However, in other arrangements, the interconnects for a particular chip-to-chip connection(s), such as the interconnects 85, could be conductive pillars, solder bumps, solder micro bumps or other types of interconnects.

The semiconductor chips 20, 25, 30, 35 and 40 can be any of a variety of integrated circuits. A non-exhaustive list of examples includes processors, such as microprocessors, graphics processing units, accelerated processing units that combine aspects of both, memory devices, an application integrated specific circuit or other. In one arrangement, the semiconductor chip 20 can be a processor and the semiconductor chips 25, 30, 35 and 40 can be memory chips, such as DRAM, SRAM or other.

Through chip electrical conductivity is provided by plural through-chip-vias (TCV). For example, the semiconductor chip 20 includes plural TCVs 115 that are connected to the interconnects 70 and to I/Os 120. The TCVs 115 (and any related disclosed conductors, such as pillars and pads) can be composed of various conductor materials, such as copper, silver, gold, platinum, palladium or others. Typically, each TCV 115 is surrounded laterally by a liner layer (not shown) of SiOx or other insulator and a barrier layer of TiN or other barrier materials. The semiconductor chip 25 similarly includes TCVs 125 that are connected between the interconnects 70 and 75. The semiconductor chip 30 includes TCVs 130 that connect between the interconnects 75 and 80 and the semiconductor chip 35 includes TCVs 135 that connect between the interconnects 80 and 85. Finally the semiconductor chip 40 includes plural TCVs 140, which in this illustrative arrangement are not revealed, but of course could be revealed using the thinning/reveal processes disclosed herein to facilitate interconnection with yet another chip stacked on top of the stack 15 if desired. The I/Os 120 enable the semiconductor chip device 10 to interface electrically with another component such as another semiconductor chip, an interposer, a circuit board or other device, and can be solder bumps, balls or other types of interconnect structures. Well-known lead free solders, such as Sn—Ag, Sn—Ag—Cu or others can be used for the I/Os 120 and other solder structures disclosed herein. Fabrication of the I/Os 120 can entail a pick and place and reflow or a solder stencil or other process.

Figure 2:
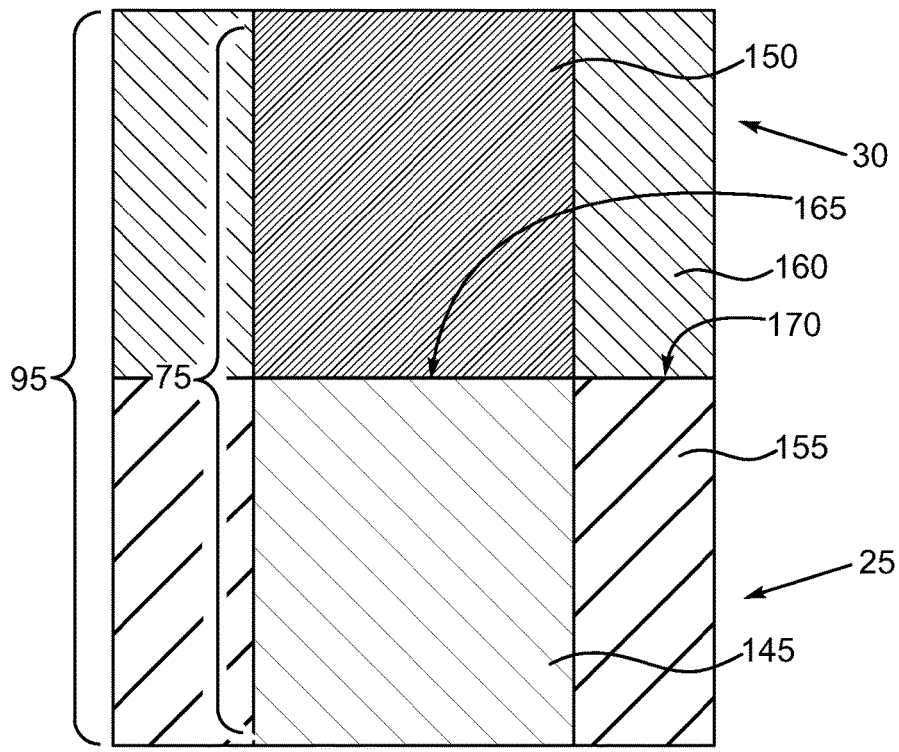
FIG. 2 is a portion of FIG. 1 shown at greater magnification illustrating a bumpless interconnect of two conductor pads.

Additional details of an exemplary arrangement of the interconnects 75 and insulating layer 95 will be described now in conjunction with FIG. 2. FIG. 2 depicts one of the interconnects 75 at greater magnification. The following description will be illustrative of the other interconnects 70, 80 and 85 and other insulating layers 90, 100 and 105 as well. As shown in FIG. 2, each of the interconnects 75 consists of a bumpless oxide hybrid bond. In this regard, the interconnect 75 between the semiconductor chip 25 and the semiconductor chip 30 is made up of a metallurgical bond between a bond pad 145 of the semiconductor chip 25 and a bond pad 150 of the semiconductor chip 30. The bond pad 145 is connected to a TCV 120 of the semicondutor chip 25 or other conductor structure (not visible) and the bond pad 150 is connected to a TCV 130 or other conductor structure (not visible) of the semiconductor chip 30. In addition, the insulating layer 95 joins the semiconductor chip 25 to the semiconductor chip 30 and consists of a glass layer 155, such as silicon oxynitride, of the semiconductor chip 25 and another glass layer 160, such as SiOx, of the semiconductor chip 30. The glass layers 155 and 160 are preferably deposited on the semiconductor chips 25 and 30, respectively, by plasma enhanced chemical vapor deposition (PECVD). The bond pad 145 is positioned in the glass layer 155 and the bond pad 150 is positioned in the glass layer 160. The bond pad 145 and the bond pad 150 are metallurgically bonded by way of an anneal process. In this regard, the semiconductor chip 30 is brought down or otherwise positioned on the semiconductor chip 25 so that the glass layer 160 is on or in very close proximity to the glass layer 15 and the bond pad 150 is on or in very close proximity to the bond pad 145. Thereafter, an anneal process is performed, which produces a transitory thermal expansion of the bond pads 145 and 150 bringing those structures into physical contact and causing them to form a metallurgical bond that persists even after the semiconductor chips 25 and 30 are cooled and the bond pads 145 and 150 contract thermally. Copper performs well in this metal bonding process, but other conductors, such as gold, platinum, palladium, or the like could be used. There is also formed an oxide/oxide or oxide/oxynitride bond between the glass layer 155 and the glass layer 160. Exemplary anneal processes will be described below in conjunction with subsequent figures.

The preferred post anneal spatial arrangement includes a relatively planar and fully expansive interface 165 between the conductor pads 145 and 150 and a relatively planar glass bond interface 170 between the glass layer 155 and the glass layer 160. However, in actual practice and as described in more detail below, the actual post anneal interface 165 can be something less than completely expansive across the lateral width of the pads 145 and 150 and may be irregular in certain places depending upon a variety of parameters.

Figure 3:
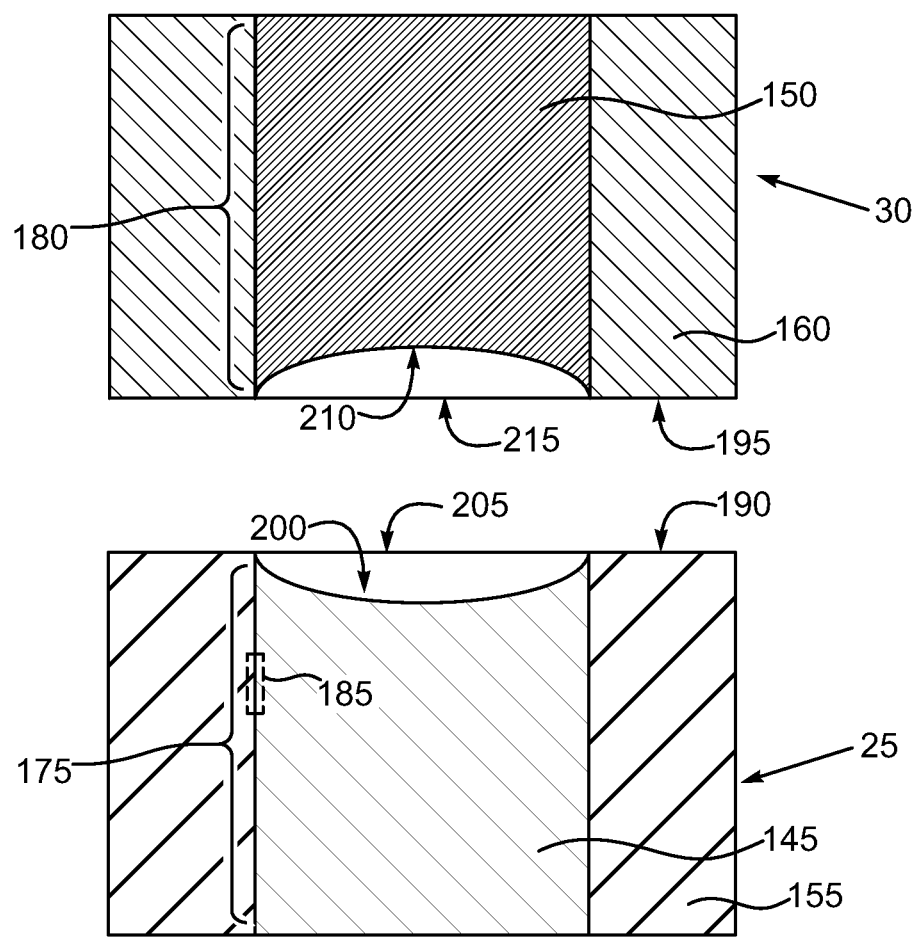
FIG. 3 is a sectional view depicting the two exemplary conductor pads prior to stacking and annealing.
Figure 4:
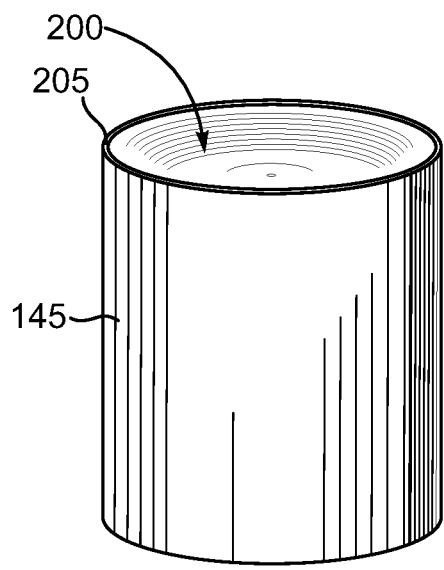
FIG. 4 is a pictorial view depicting one of the exemplary conductor pads.
Figure 5:
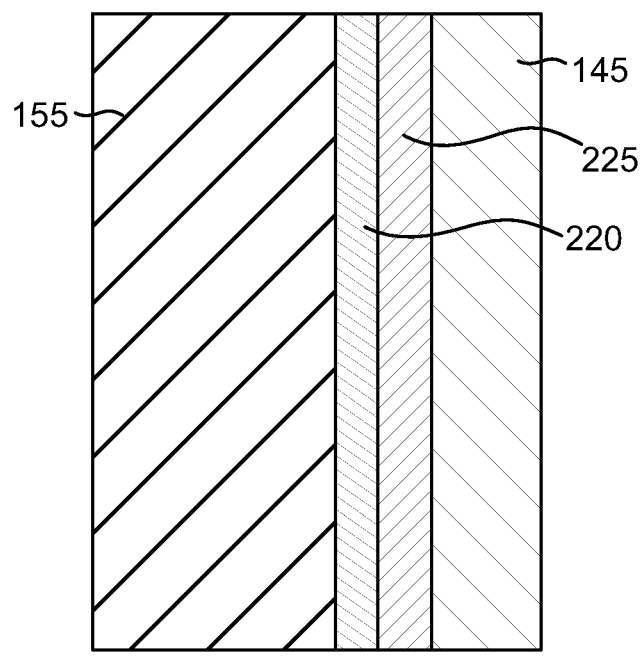
FIG. 5 is a portion of FIG. 3 shown at greater magnification.

Additional details of the exemplary hybrid oxide bonding process can be understood by referring now also to FIGS. 3, 4, 5, 6, 7, 8, 9 and 10 and initially to FIGS. 3 and 4. FIG. 3 is a sectional view like FIG. 2, but depicting the pre-bonding positions of the semiconductor chip 25 and the semiconductor chip 30 and FIG. 4 is a pictorial view of the conductor pad 145. The conductor pads 145 and 150 are formed in respective openings 175 and 180 in the glass layers 155 and 160. Wafer level processing is preferred, but not required. The openings 175 and 180 are fabricated in the glass layers 155 and 160, respectively, using well-known masking and etching techniques. Next, the conductor pads 145 and 150 are formed in the openings 175 and 180, respectively, using well-known masking, plating, CVD, physical vapor deposition (PVD) or combinations of these techniques. Note the location of the dashed rectangle 185 in FIG. 3, which encompasses a small portion of the interface between the conductor pad 145 and the glass layer 155. That portion circumscribed by the dashed rectangle 185 is shown at greater magnification in FIG. 5 and will be used to describe additional features of the conductor pad 145 below. Following the formation of the conductor pads 145 and 150, a CMP process is performed to planarize the surfaces 190 and 195 of the glass layers 155 and 160, respectively. The surfaces 190 and 195 of the glass layers 155 and 160, respectively, are plasma treated following CMP to render them hydrophillic. The hydrophillic surfaces 190 and 195 will eventually be placed together and annealed to create a bond. A fall out, albeit an undesirable one, of typical CMP processing is that the conductor pads 145 and 150 become dished. A typical CMP polish pad is rubbery and tends to push down into and scour the softer conductor pads 145 and 150 more readily than the relatively harder glass layers 155 and 160. Thus, the conductor pad 145 has a dished region 200 that has a somewhat elliptical profile and terminates at an upper rim 205. The conductor pad 145 and the dished region 200 and rim 205 thereof are depicted in a pictorial view in FIG. 4. The conductor pad 150 similarly has a dished region 210 that has a generally elliptical profile and a rim 215. Referring now also to FIG. 5, which is the portion of FIG. 3 circumscribed by the dashed rectangle 185 magnified, prior to the fabrication of the conductor pad 145, a thin (10 to 50 Å) liner barrier layer 220 is established in the opening 175 shown in FIG. 3. The barrier layer 220 is preferably composed of $Ta_2O_5$, TaN, TiN, or other types of barrier layer materials suitable to prevent copper or other metals from diffusing out through the sidewalls of the opening 175 shown in FIG. 3. Next, in circumstances where copper is used, a copper seed layer 225 can be deposited in the opening 175 and on the barrier layer 220 preferably by electroless plating. Thereafter, a bulk plating process can be used to establish the conductor pad 145. The foregoing description of the various layers 190 and 195 interposed between the conductor pad 145 and the glass layer 155 is applicable to the interface between the conductor pad 150 and the glass layer 160 as well and obviously the other bumpless oxide bonds depicted and disclosed herein.

Figure 6:
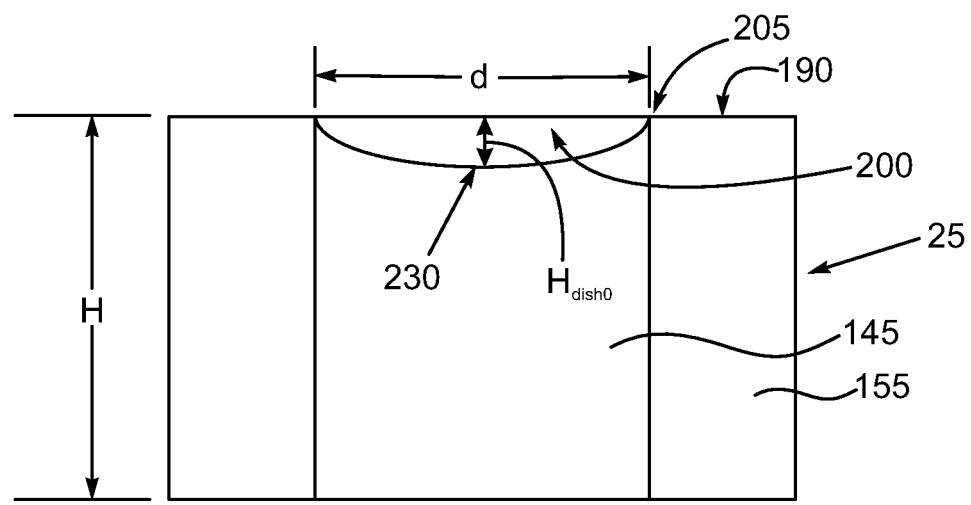
FIG. 6 is a sectional view of one of the exemplary conductor pads without cross-hatching.
Figure 7:
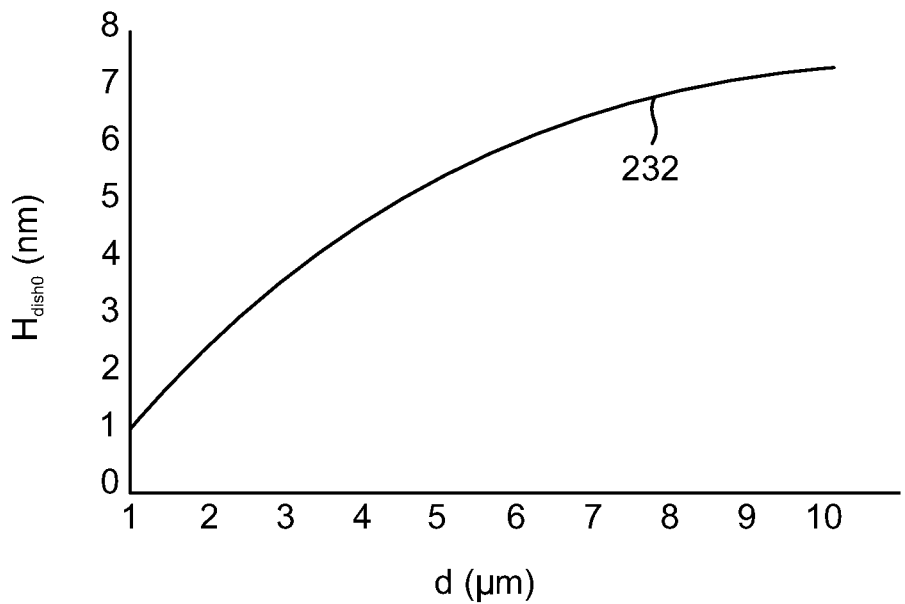
FIG. 7 is a plot of empirically derived pad dishing data.

Additional details of the basic geometry of the conductor pads 145 and 150 may be understood by referring now also to FIG. 6, which is a simplified view of the semiconductor chip 25 depicted in FIG. 3, but without cross-hatching so that various structural features can be better viewed. The following description is illustrative of the conductor pad 150 as well. As shown in FIG. 6, as a result of the aforementioned dishing phenomenon, the rim 205 of the dished region 200 is substantially conterminous with the surface 190 of the glass layer 155. However, the central portion 230 the dished region 200 is positioned below the surface 190 by some distance $H_{dish0}$. The quantity $H_{dish0}$ corresponds to the underformed state of the conductor pad 145 depicted in FIGS. 3, 4 and 6. The conductor pad 145 has some diameter d and total height H, and as described in more detail below, the parameters $H_{dish0}$, d and H have various processing ramifications. Empirically derived data of dishing $H_{dish0}$ as a function of pad diameter d for a copper pad are depicted graphically as the plot 232 in FIG. 7. A least squares curve fit of the plot 232 in FIG. 7 yields the following relationship between $H_{dish0}$ and d:

$$h_{dish0} = -0.0827\ d^2 + 1.5747\ d - 0.4911 \quad (1)$$

Figure 8:
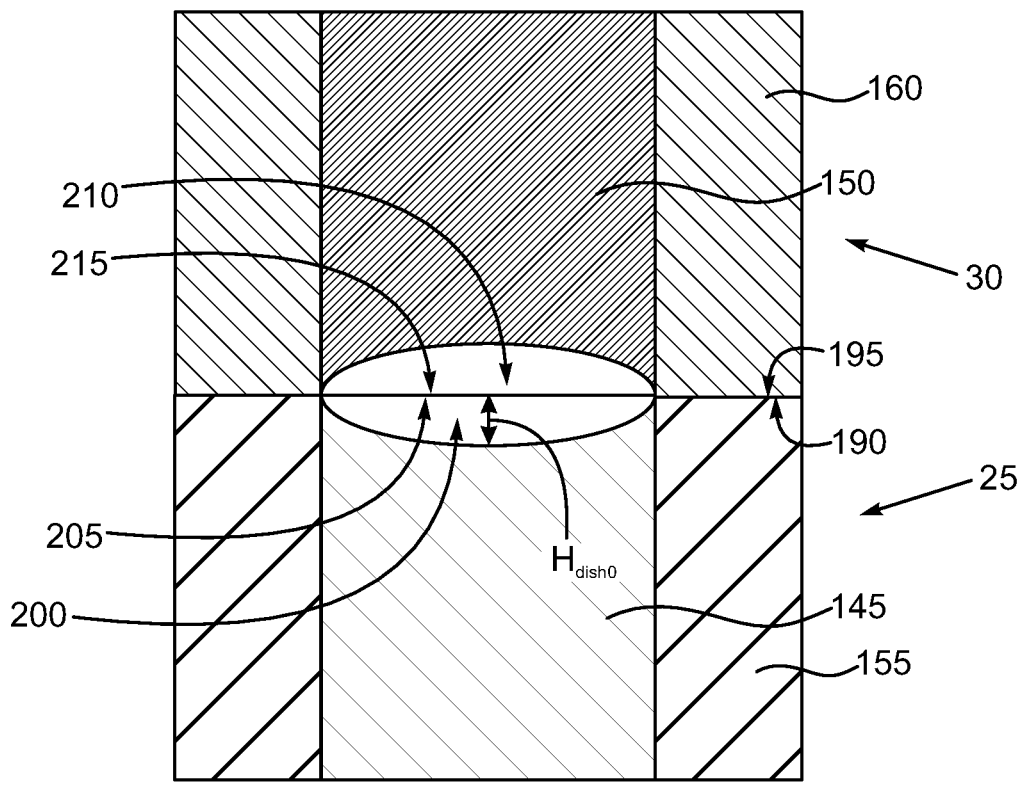
FIG. 8 is a sectional view depicting the two exemplary conductor pads prior to annealing.

Referring again to FIG. 3, prior to seating the chip 30 on the chip 25, the surfaces 190 and 195 of the respective glass layers 155 and 160 undergo a plasma treatment process to render the surfaces 190 and 195 hydrophillic. This is to facilitate the subsequent oxide bonding of the surfaces 190 and 195. Next and as shown in FIG. 8, the chip 30 is seated on the chip 25 such that the surfaces 190 and 195 of the glass layers 155 and 160, respectively, are either directly in contact or extremely close. At this point, the rim 205 of the conductor pad 145 is very close to and possibly even touching the rim 215 of the conductor pad 150, and the dished region 200 is dished to distance $H_{dish0}$ and the dished region 210 is also dished at $H_{dish0}$ or something close to it.

Figure 9:
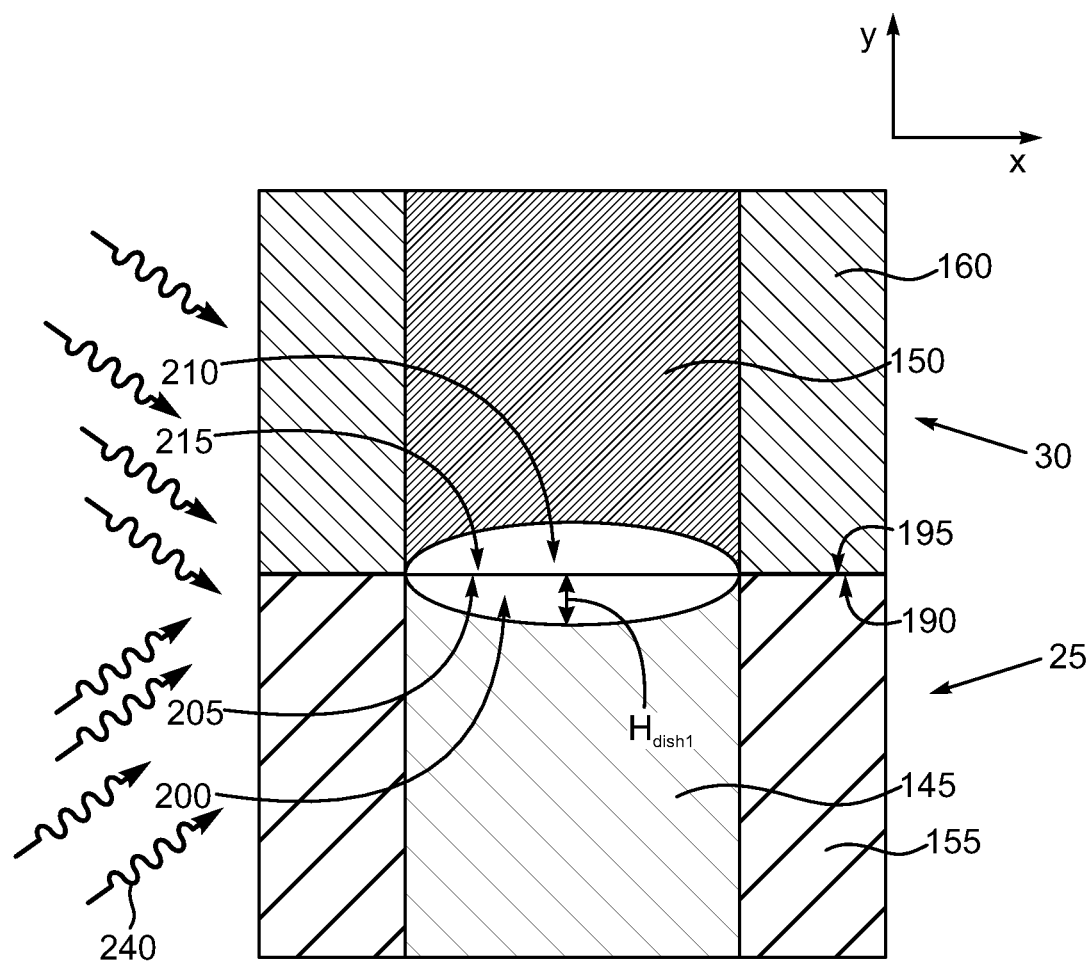
FIG. 9 is a sectional view like FIG. 8, but depicting exemplary annealing to initiate pad contact.
Figure 10:
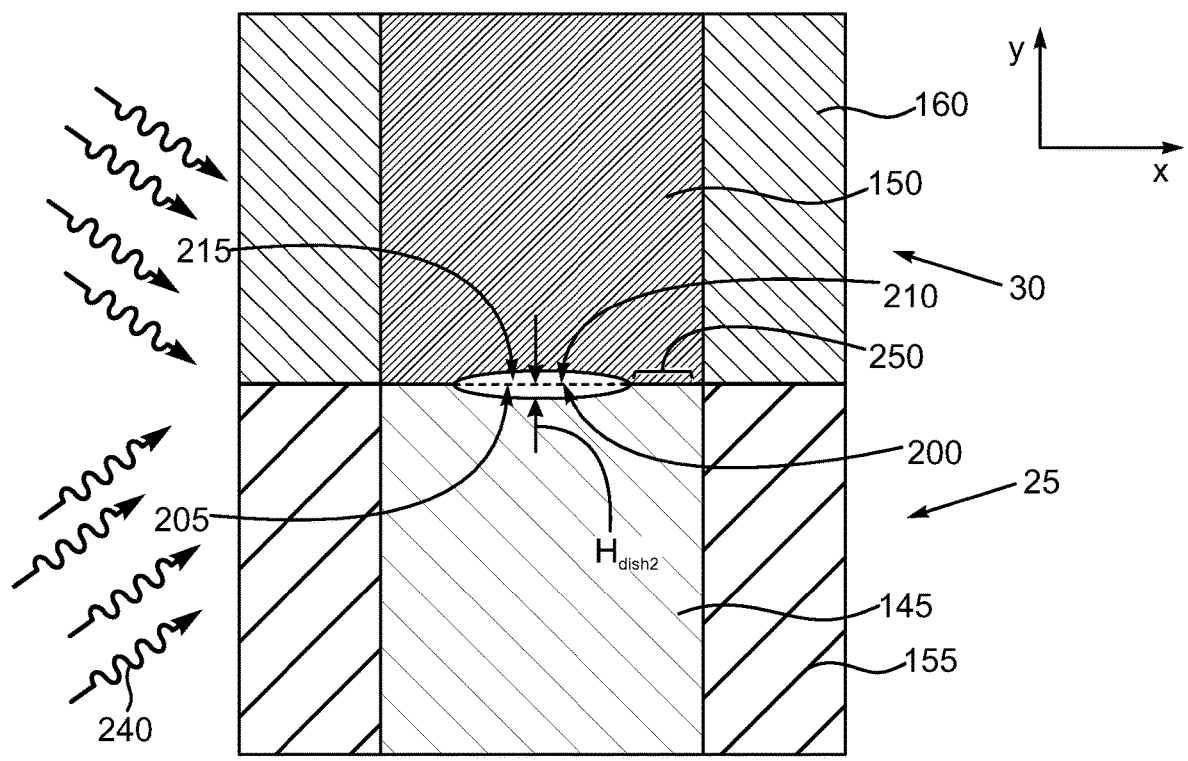
FIG. 10 is a sectional view like FIG. 9, but depicting exemplary additional annealing to increase pad contact.

Next and as shown in FIG. 9, the combination of the semiconductor chips 25 and 30 undergoes two anneal processes represented schematically by the arrows 240. The first anneal 240 is at about 150° C. for about 1 hour and is designed to form the bonding between the glass layers 155 and 160. Next, a second anneal process is performed to produce a thermal expansion and ultimately a plastic deformation of the conductor pads 145 and 150. As the temperature is ramped up during the second anneal process 240, the conductor pads 145 and 150 undergo thermal expansion in an unconstrained fashion along a y-axis but with constraint along the x-axis due to the bonds with the glass layers 155 and 160. At the outset of the anneal process 240, the rims 205 and 215 touch. The temperature at which one or more other points of the pads 145 and 150 make first contact can be termed temperature $T_1$. At first contact at $T_1$, the dished regions 200 and 210 will have some dished distance $H_{dish1}$, which is most likely slightly smaller than or even equal to $H_{dish0}$. If the temperature during the anneal 240 is further increased beyond $T_1$, then the conductor pads 145 and 150 will continue to exhibit thermal expansion along the y-axis with constraint along the x-axis but also with constraint along the y-axis at those points where the conductor pad 145 and the conductor pad 150 are contacting. As the temperature increases and additional thermal expansion occurs, the areas of contact between the conductor pads 145 and 150 will naturally increase as the pads 145 and 150 continue to deform. For example, and as shown in FIG. 10, after the temperature is ramped up beyond $T_1$, the area of contact 250 between the pads 145 and 150 is increased and the amount of dishing for each of the pads 145 and 150 is reduced down to some smaller value $H_{dish2}$. The dished regions 200 and 210 have shrunk, but it should be understood that the deformation can have something other than the elliptical profile depicted.

Figure 11:
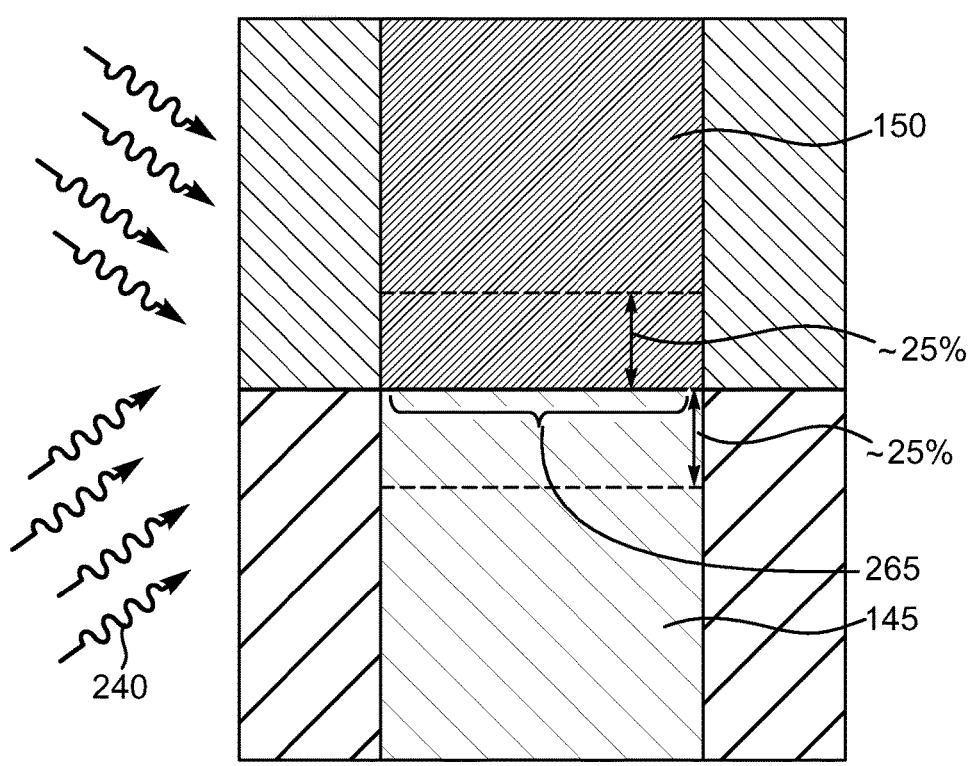
FIG. 11 is a sectional view like FIG. 9, but depicting exemplary additional annealing to increase bonding of the conductor pads.

As shown in FIG. 11, the anneal 240 is continued up to some temperature $T_2$ ($T_2$ is a $\Delta T$ above $T_1$) at which the following mechanical transformations take place. First, the approximately upper 25% (on a volume basis) of the conductor pad 145 undergoes plastic deformation with an average effective plastic strain of at least 0.2% and the corresponding approximately lower 25% (on a volume basis) of the conductor pad 150 similarly undergoes plastic deformation to an average effective plastic strain of at least 0.2%. The preferred result is a substantially continuous interface 265 between the pads 145 and 150 to facilitate good electrical conductivity there between. To recap, $T_1$ is the temperature that produces first contact between the pads 145 and 150 and $T_2$ is the increase in temperature over $T_1$, which produces the desired plastic deformation of, and the resultant sustained physical contact between, the pads 145 and 150. The overall bonding temperature $T_b$ is therefore defined as $T_b = T_1 + T_2$.

Figure 12:
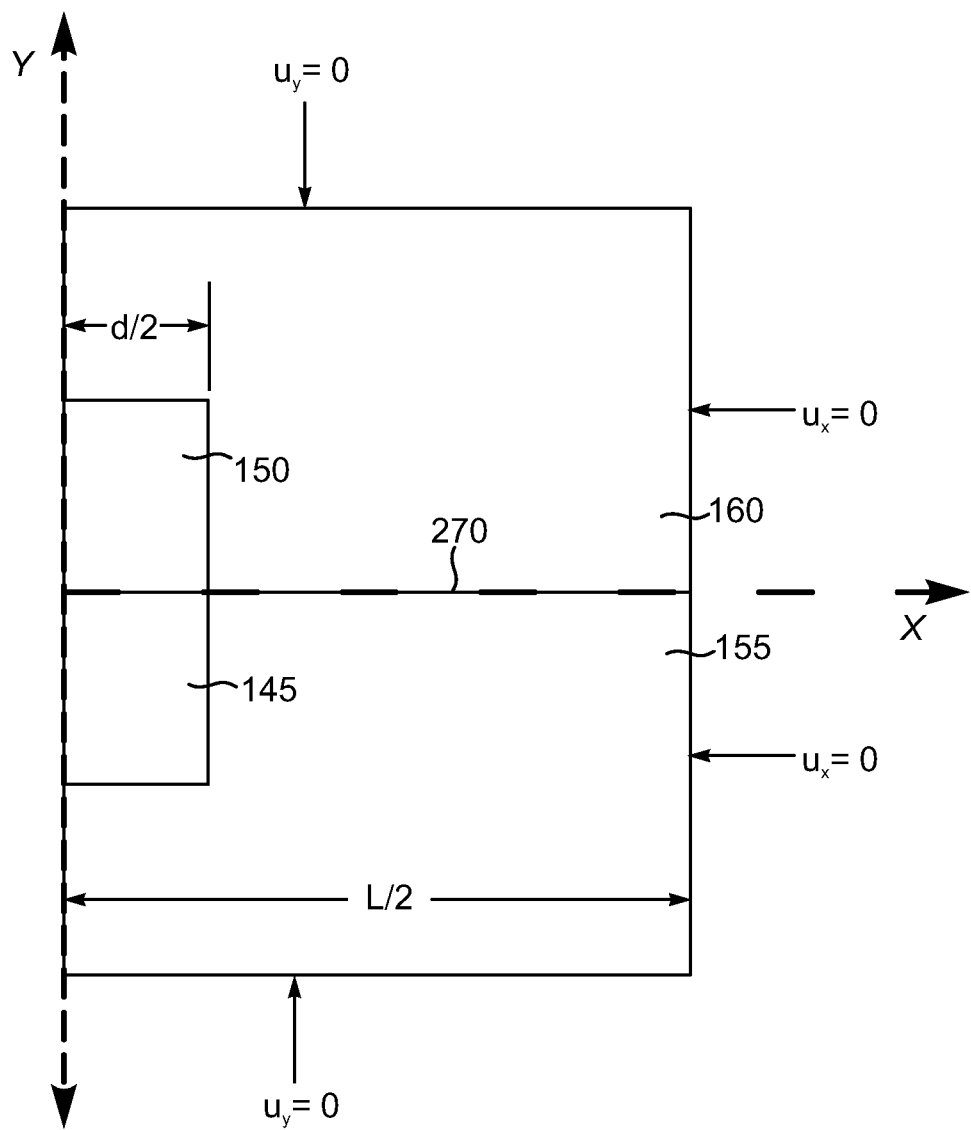
FIG. 12 is a schematic diagram illustrating an exemplary model setup to investigate bonding temperature dependence on pad characteristics.

It is desirable for bonding temperature $T_b$ to be as low as possible while still providing adequate post anneal bonding and spatial relationships between the conductor pads 145 and 150. This follows from the fact that the higher $T_b$ is, the more chance there is for structures of the semiconductor chips 25 and 30 and the other chips disclosed in FIG. 1, for example, to be damaged, which can lead to less than desirable post fabrication electrical performance. It is believed that $T_b$ is a function of pad parameters, such as $H_{dish0}$, H and d depicted in FIG. 6. Additional variables include the Young's modulus, coefficient of thermal expansion (CTE) a, yield strength and hardness for the materials used to fabricate the pads 145 and 150. To investigate some possible techniques to lower the value of $T_b$ for a given configuration, two-dimensional axisymmetric modeling was performed. The basic model setup for the 2D axisymmetric modeling may be understood by referring now also to FIG. 12. FIG. 12 is an axisymmetric cross-section of two conductor pads, for example the conductor pads 145 and 150. Each of the halves of the pads 145 and 150 has a lateral dimension d/2, and is shown relative to an axis of symmetry, which happens to be the y-axis in the illustrated x-y coordinate system. The glass layer 155 and the glass layer 160 are shown schematically. For the model, it is assumed that at some length, L/2, along the x-axis, the displacement $u_x$ of the glass layers 155 and 160 is 0 and at some distance y along the axis of symmetry the vertical displacement $u_y$ of the glass layers 155 and 160 is 0. L/2 is 60 microns. The following are additional model assumptions: copper pads 145 and 150, $SiO_2$ glass layers 155 and 160, perfect glass bonding between at the interface 270 between the glass layers 155 and 160, perfect bonding between the pads 145 and 150 and the glass layers 155 and 160, respectively, symmetry with respect to the x-axis and steady state analysis. It is assumed in model that the dishing depth $H_{dish0}$ increases with pad diameter d according to Equation (1), which is derived from the empirical data of $H_{dish0}$ versus pad diameter d. In addition, the following table illustrates the basic material properties for copper and $SiO_2$ assumed for the model:

TABLE

Figure 13:
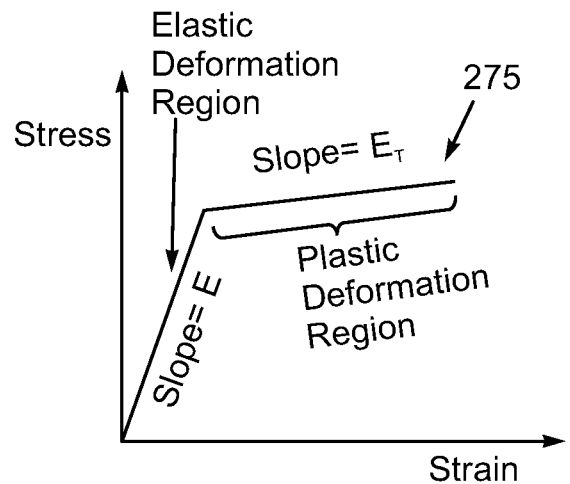
FIG. 13 is an exemplary stress versus strain curve.
Figure 14:
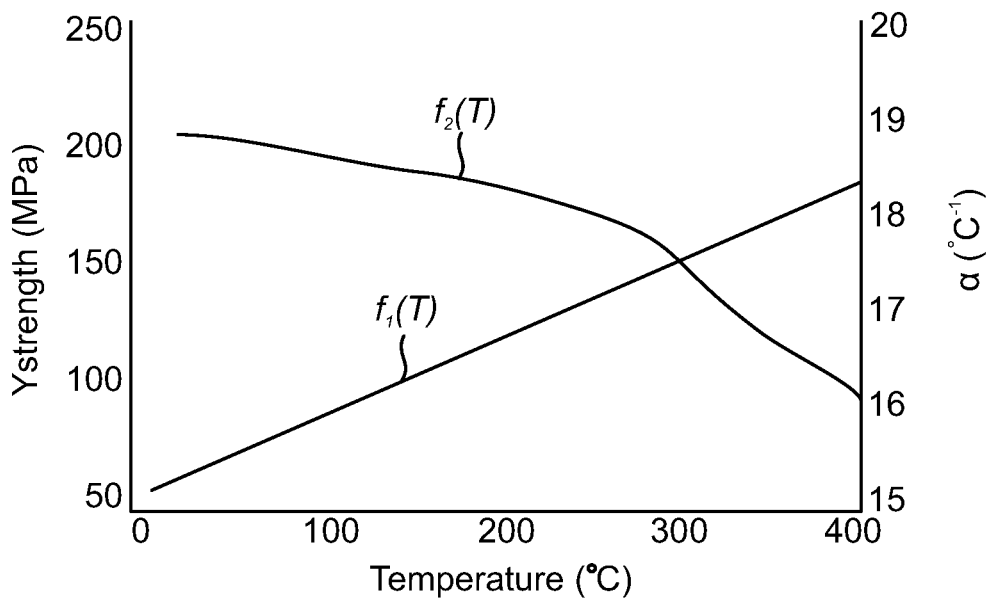
FIG. 14 is an exemplary plot of yield strength and CTE versus temperature.

| Material Parameter | Copper (Elastic-plastic) | $SiO_2$ (Linear elastic) |
|---|---|---|
| E (GPa) | 129.8 | 67 |
| v | 0.343 | 0.15 |
| α (° C.$^{-1}$) | $f_1$(T) | 0.55 × 10$^{-6}$ |
| $Y_{Strength}$ (GPa) | $f_2$(T) | N/A |
| $E_T$ (GPa) | 1.12 | N/A | where E is Young's modulus (the slope E of the elastic deformation region of the stress versus strain curve 275 shown in FIG. 12), v is Poisson's ratio, a is CTE, $Y_{strength}$ is yield strength and $E_T$ is the slope of plastic deformation region of the stress versus strain curve 275 shown in FIG. 13 (otherwise known as the tangent modulus). The values $f_1$(T) and $f_2$(T) of a and $Y_{strength}$, respectively, are temperature dependent as illustrated in FIG. 14. Model calculations were performed using finite element analysis software. Examples include Abaqus and Ansys, but of course other finite element analysis software tools could be used.

Figure 15:
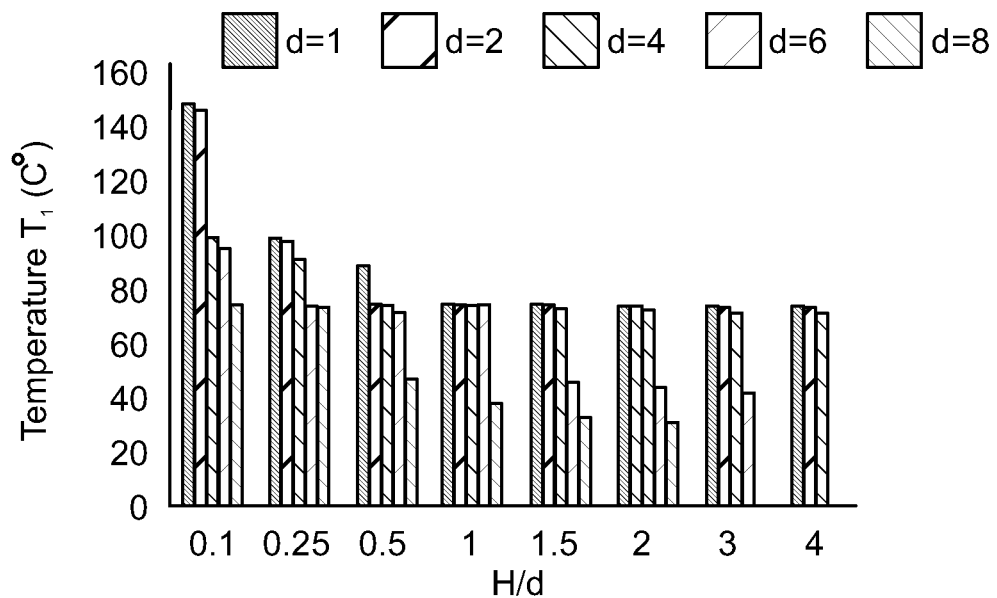
FIG. 15 depicts bar charts of modeled temperature versus pad aspect ratio.
Figure 16:
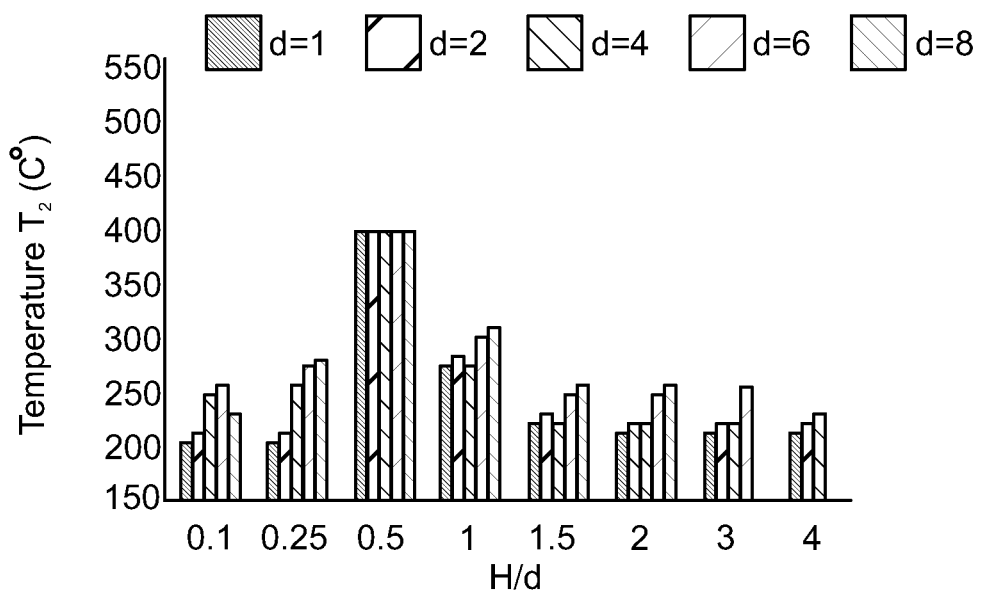
FIG. 16 depicts bar charts of modeled temperature versus pad aspect ratio.
Figure 17:
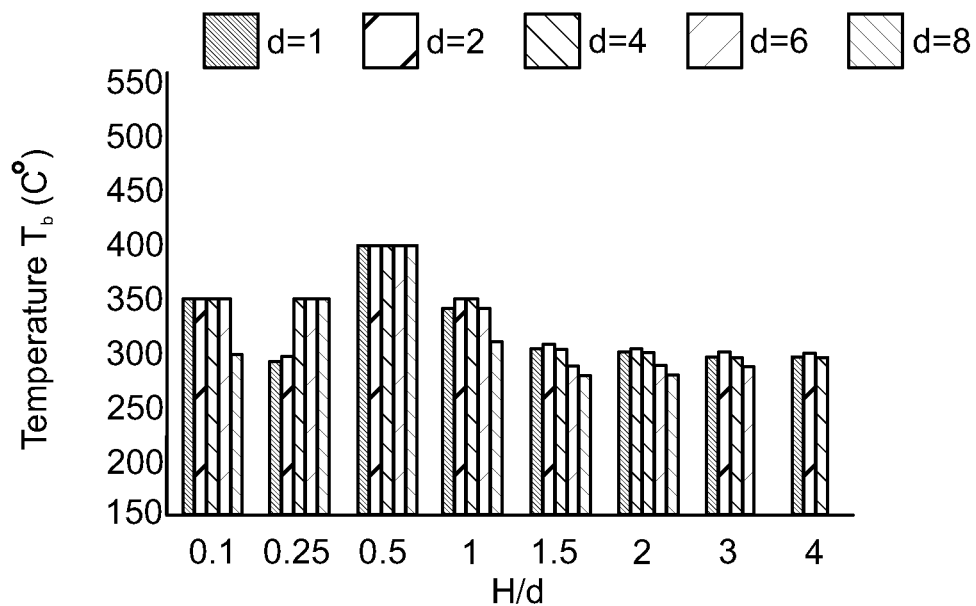
FIG. 17 depicts bar charts of modeled temperature versus pad aspect ratio.

FIGS. 15-20 depict results of the modeling in bar chart format. FIG. 15 shows temperature $T_1$ of first pad contact for a variety of combinations of the pad aspect ratio H/d (pad thickness H over pad diameter) for pad diameters d=1, 2, 4, 6 and 8. FIG. 16 shows temperature $T_2$ for the same variety of combinations of the aspect ratio H/d as FIG. 15 and FIG. 17 shows bonding temperature $T_b$ (recall $T_b=T_1+T_2$) for the same variety of combinations of the aspect ratio H/d as FIGS. 15 and 16. Some trends stand out from FIGS. 15-17. Keeping in mind that reducing $T_b$ is a technical objective, for a given pad diameter d, a ratio H/d≤0.25 or ≥1 is favorable. Applicants surmise that there at least three possible techniques to make it easier for the conductor pads 145 and 150 to deform as desired but at reduced bonding temperatures $T_b$: (1) reduce pad dishing $H_{dish0}$; (2) increase the pad CTE α; or (3) reduce the yield strength $Y_{strength}$ of the pads 145 and 150. Option (1) will reduce $T_1$, option (2) will reduce both $T_1$ and $T_2$ and option (3) will reduce $T_2$.

Figure 18:
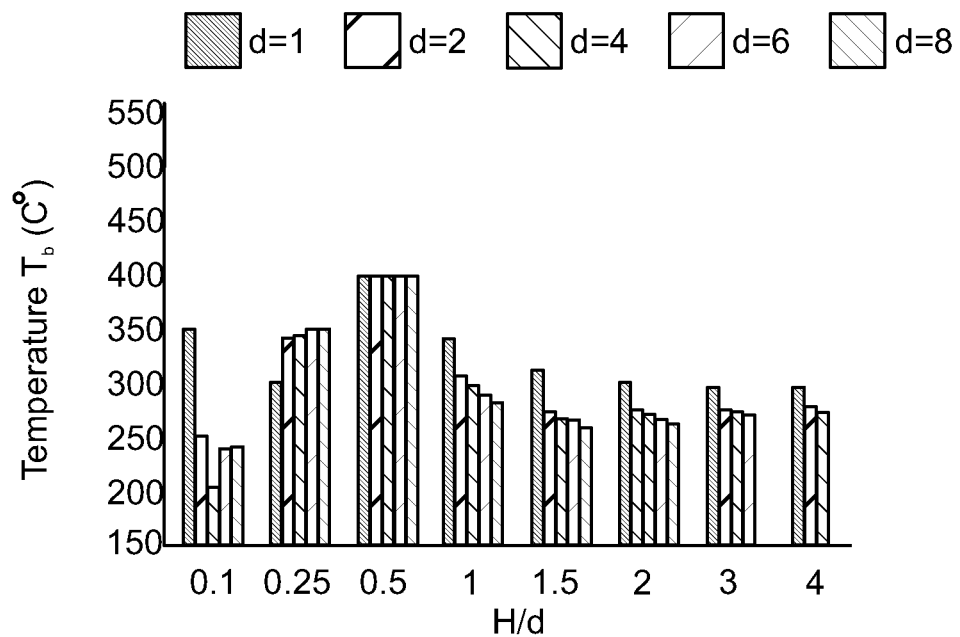
FIG. 18 depicts bar charts of modeled temperature versus pad aspect ratio.
Figure 19:
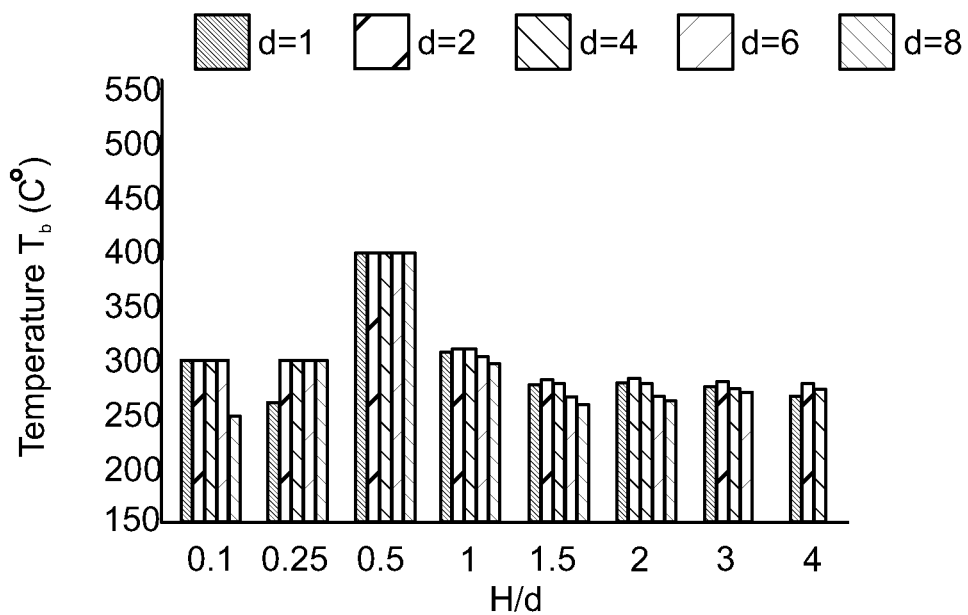
FIG. 19 depicts bar charts of modeled temperature versus pad aspect ratio.
Figure 20:
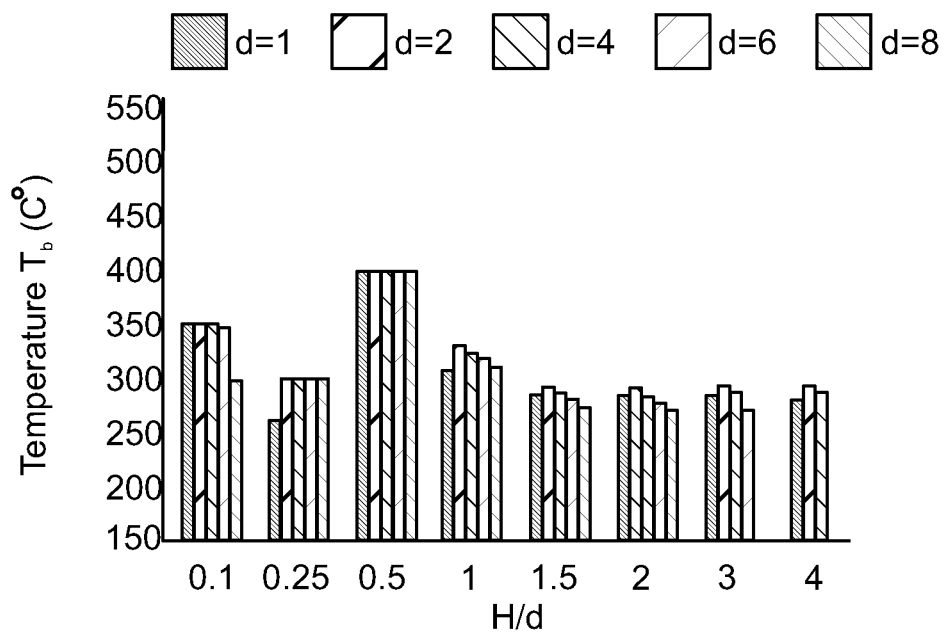
FIG. 20 depicts bar charts of modeled temperature versus pad aspect ratio.

Modeled data for option (1) is shown in FIG. 18. The same variety of combinations of the aspect ratio H/d as FIGS. 15-17 is used. However, a value of $H_{dish0}$ of 1.0 nm is assumed for all values of d. FIG. 18 shows that $T_b$ is reduced to below 240° C. for some pad diameters d with a H/d=0.1. Although not strictly evident from FIG. 17, it is noted that, for most combinations of d and H/d, $T_1$ was reduced but $T_2$ was increased, but overall $T_b$ was reduced. Modeled data for option (2) is shown in FIG. 19. The same variety of combinations of the aspect ratio H/d as FIGS. 15-18 is used. However, a CTE of 1.2α (i.e., 20% increased CTE) is assumed. FIG. 19 shows that $T_b$ is reduced to below 260° C. for some pad diameters d with a H/d=0.25. Although not strictly evident from FIG. 18, it is noted that, for all combinations of d and H/d, both $T_1$ and $T_2$ were reduced, and overall $T_b$ was reduced. Modeled data for option (3) is shown in FIG. 20. The same variety of combinations of the aspect ratio H/d as FIGS. 15-19 is used. However, a yield strength of 0.8Ystrength (i.e., 20% decreased yield strength) is assumed. FIG. 20 shows that $T_b$ is reduced to below 280° C. for some pad diameters d with a H/d=0.25, 1.5, 2, 3 and 4. Although not strictly evident from FIG. 20, it is noted that, for all combinations of d and H/d, $T_1$ remained unchanged, $T_2$ was reduced, and overall $T_b$ was reduced. Thus, the modeling confirmed the viability of options (1), (2) and (3) as techniques to reduce $T_b$.

Figure 21:
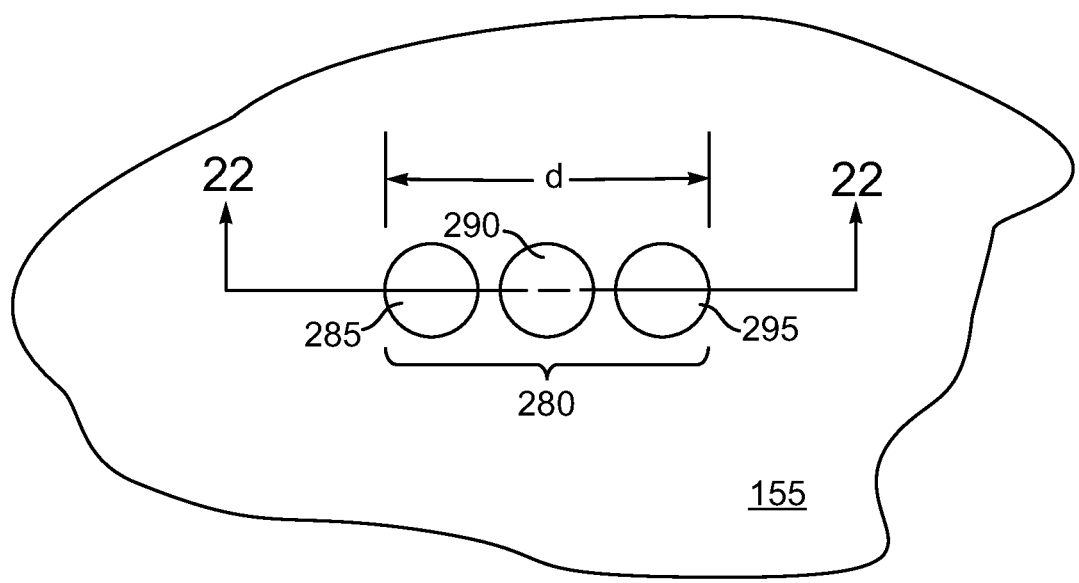
FIG. 21 is a plan view of an exemplary conductor pad group and glass layer.
Figure 22:
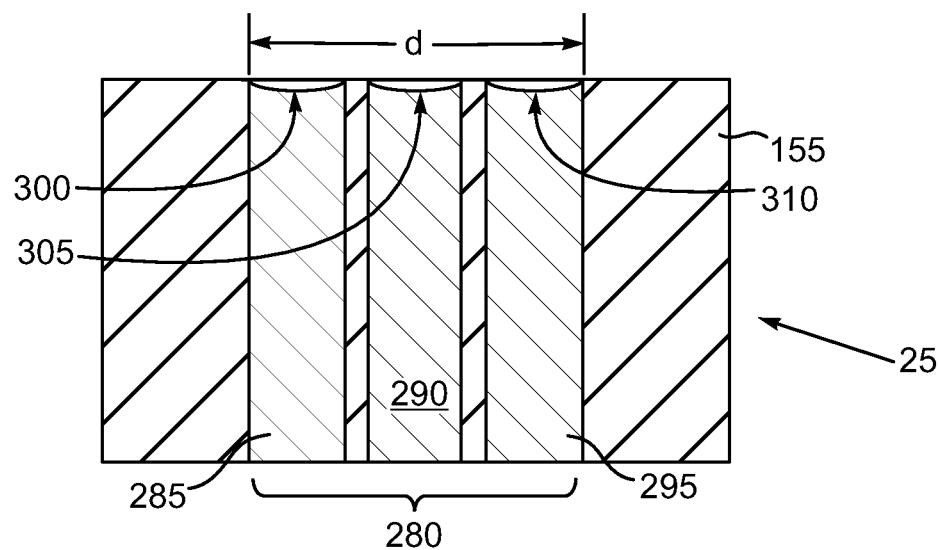
FIG. 22 is a sectional view of FIG. 21 taken at section 22-22.

Exemplary techniques to implement option (1), a reduction in pad dishing, will now be described. FIG. 21 is a plan view of a portion of the glass layer 155 of the semiconductor chip 25 and an exemplary conductor pad group 280 that serves the function of the aforementioned conductor pad 145. FIG. 22 is a sectional view of FIG. 21 taken at section 22-22. Here, instead of using a single conductor pad 145 as described above and depicted in other figures, the conductor pad group 280 includes, in this illustrative arrangement, three pads 285, 290 and 295 that can be sized and arranged to have the same general diameter or lateral dimension d as the conductor pad 145. Each of the pads 285, 290 and 295 is operable to carry current. The objective is to provide multiple, smaller diameter features that are more resistant to dishing than comparatively larger diameter features, while still providing desired electrical connectivity and resistivity. In other words, the pads 285, 290 and 295 will have dished regions 300, 305 and 310, respectively, but the depth of those dished regions 300, 305 and 310 will be more shallow than a corresponding conductor pad, such as the conductor pad 145 with diameter d. Here, the pads 285, 290 and 295 number three and are arranged along a line. However, virtually any arrangement of the pads 285, 290 and 295 as well as the number thereof can be used. For example, various types of cluster arrangements, squares, rectangles, or other shapes can be used. The conductor pad group 280 can be fabricated using the same techniques described elsewhere herein simply by modifying the patterning steps as necessary. The conductor pad group 280 is designed to hybrid bond with a corresponding conductor pad group on a chip stacked thereon, such as the chip 30 depicted in FIG. 1.

Figure 23:
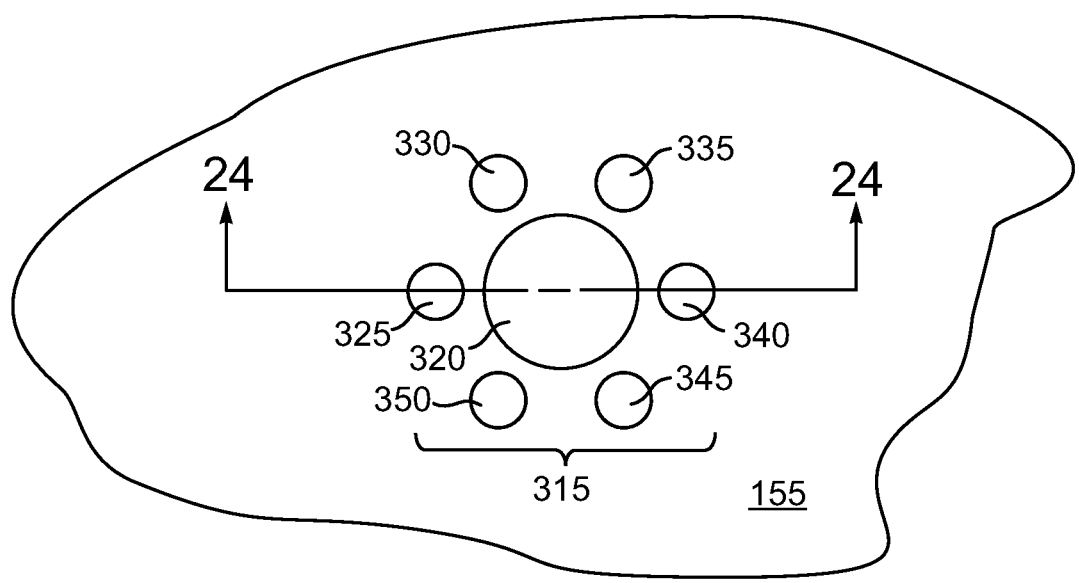
FIG. 23 is a plan view of an alternate exemplary conductor pad group and glass layer.
Figure 24:
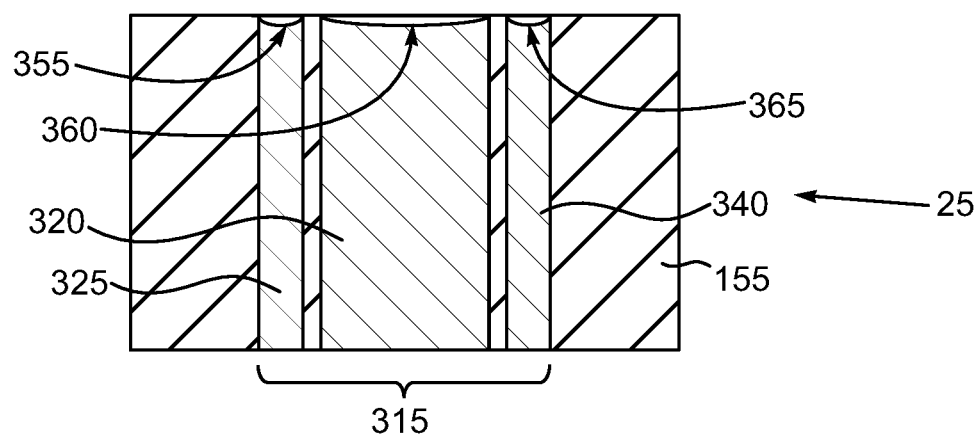
FIG. 24 is a sectional view of FIG. 23 taken at section 24-24.

Another exemplary or arrangement for conductor pads that reduce dishing can be understood by referring now to FIGS. 23 and 24. FIG. 23 is a plan view of a portion of the glass layer 155 of the semiconductor chip 25 and FIG. 24 is a sectional view of FIG. 23 taken at section 24-24. Here, an alternate exemplary conductor pad group 315 consists of a main conducting pad 320 surrounded by plural adjacent dummy pads 325, 330, 335, 340, 345 and 350. Note that because of the location of section 24-24, the main conductor pad 320 and two of the dummy conductor pads 325 and 340 are visible in FIG. 24. This approach uses a CMP phenomenon known as pattern density influence. Due to the effects of pattern density provided by the dummy pads 325, 330, 335, 340, 345 and 350, the dishing of the main conductor pad 320 is reduced during the CMP process. The main conductor pad 320 is operable to carry current while the dummy pads 325, 330, 335, 340, 345 and 350 are not. The main conductor pad 320 and the dummy pads 325, 330, 335, 340, 345 and 350 will have dished regions 355, 360 and 365, respectively, but the depth of the dished region 360 will be more shallow than a corresponding conductor pad, such as the conductor pad 145. Here, the dummy pads 325, 330, 335, 340, 345 and 350 number six and are arranged circumferentially around the main conductor pad 320 with the same angular spacing. However, virtually any arrangement of the dummy pads 325, 330, 335, 340, 345 and 350 as well as the number thereof can be used. For example, various types of cluster arrangements, squares, rectangles, or other shapes can be used. The conductor pad group 315 can be fabricated using the same techniques described elsewhere herein simply by modifying the patterning steps as necessary. The conductor pad group 315 is designed to hybrid bond with a corresponding conductor pad group on a chip stacked thereon, such as the chip 30 depicted in FIG. 1.

Figure 25:
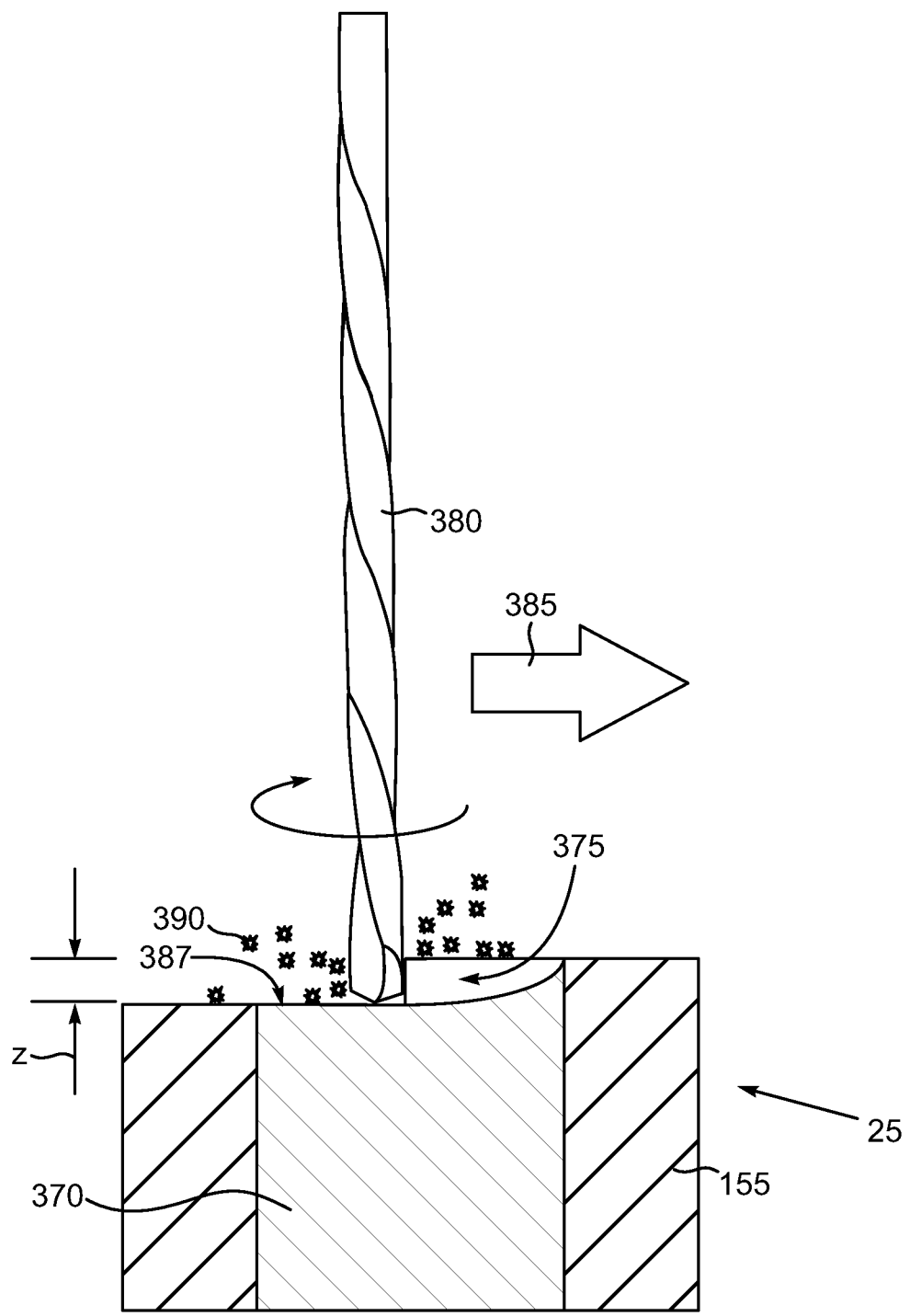
FIG. 25 a sectional view depicting exemplary machining of a conductor pad.

Another exemplary technique/arrangement to reduce or avoid dishing of a conductor pad can be understood by referring now to FIG. 25, which is a sectional view depicting a portion of the class layer 155 of the semiconductor chip 25 and a conductor pad 370. The conductor pad 370 has a dished region 375. To eliminate the dished region 375, the glass layer 155 and the conductor pad 370 are machined using a mill bit 380 or other suitable type of machine element (not drawn to scale relative to the conductor pad 370). The direction of travel of the bit 380 is depicted by the arrow 385. FIG. 25 shows the depth of cut z for the mill bit 380 to be sufficiently deep to completely eliminate the dished region 375 and leave a substantially planar upper surface. However, it is possible to use a more shallow depth of cut z and thereby eliminate some but not all of the dished region 375. In other words, a shallower depth of cut z will leave a relatively more shallow and laterally smaller dished region 375. Various cleaning processes following the machining step such as plasma and solvent cleaning should be performed in order to remove any excess cuttings 390 left over by the machining process. Optionally, the technique can be used where no prior dishing due to CMP or otherwise has occurred.

Figure 26:
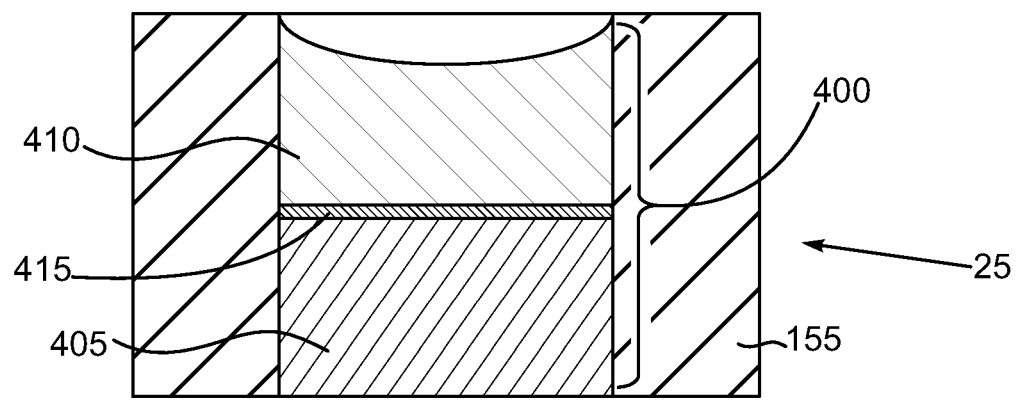
FIG. 26 is a sectional view of an alternate exemplary conductor pad.

Exemplary techniques to implement option (2), an increase in pad CTE α, will now be described. An exemplary arrangement to implement option (2) described above can be understood by referring now to FIG. 26, which is a sectional view of the glass layer 155 of the semiconductor chip 25 with a multi-layer conductor pad 400 that is designed to have a relatively greater CTE α than a comparably sized single component pad, of for example copper, such as the conductor pad 145 depicted elsewhere herein. In this illustrative arrangement, the multi-layer conductor pad 400 can include a base layer 405, a conductor/bonding layer 410 and if necessary, a barrier layer 415 positioned between the base layer 405 and the bonding layer 410. The base layer 405 is advantageously fabricated from materials that exhibit a higher CTE α than, for example, copper. Examples include aluminum and zinc. For example, aluminum has a CTE α that is approximately 35% greater than that of copper. The bonding layer 410 can be composed of material, such as copper, nickel gold, platinum, palladium, silver etc. that exhibit desirable electrical and other properties. Some materials, such as nickel, for example, have a higher hardness value than, for example copper, and thus will be more resistant to dishing due to CMP. The CTE α of materials like nickel may be less than that of copper, but the corresponding reduction in dishing due to greater hardness is believed to compensate for the reduction in CTE versus copper. Exemplary materials for the barrier layer include TiN, TiW or other similar materials. A variety of processes may be used to fabricate the base layer 405, the bonding layer 410 and the barrier layer 415, such as CVD, PVD, plating, with or without lithographic patterning and etching. More than the two layers 405 and 410 and barrier 415 could be used.

Figure 27:
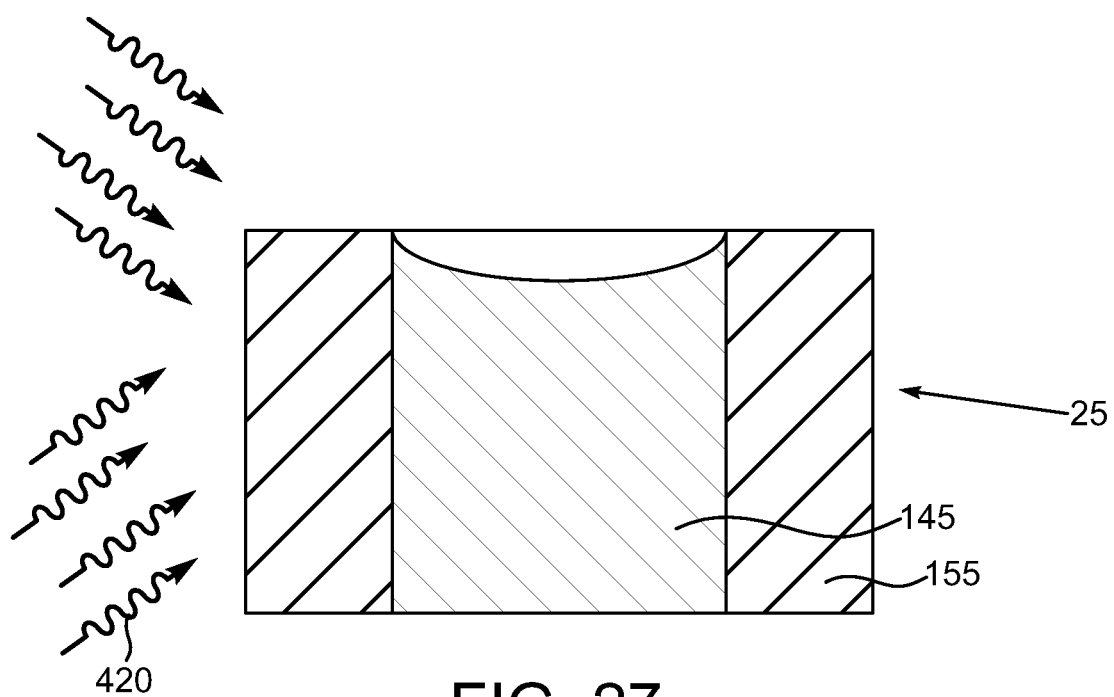
FIG. 27 is a sectional view of an alternate exemplary conductor pad and annealing process.

Exemplary techniques to implement option (3), a decrease in pad yield strength $Y_{strength}$ will now be described in conjunction with FIG. 27, which is a sectional view of the exemplary conductor pad 145 and glass layer 155 of the semiconductor chip 25. Here, to reduce the yield strength $Y_{strength}$ of the conductor pad 145, one or more specialized anneal processes, represented schematically by the arrows 420, are performed. The anneals 420 utilize the Hall-Petch Effect to reduce yield strength by increasing grain size of the conductor pad 145. A larger grain size translates into fewer grain boundaries. One exemplary process utilizes an anneal atmosphere of supercritical CO, and $H_2$ to increase the grain growth for particularly copper.

It should be understood that options (1), (2) and (3) could be combined or used as sub-combinations to achieve a synergistic effect. For example, options (1) and (2), (1) and (3), (2) and (3) or all three could be used.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a first semiconductor chip having a first glass layer and plural first groups of plural conductor pads in the first glass layer, each of the plural first groups of conductor pads including a main conductor pad and one or more dummy pads adjacent the main conductor pad and being configured to bumplessly connect to a corresponding second group of plural conductor pads of a second semiconductor chip to make up a first interconnect of a plurality of interconnects that connect the first semiconductor chip to the second semiconductor chip, each of the main conductor pads including a bottommost base layer and a bonding layer, the bottommost base layer having a greater coefficient of thermal expansion than the bonding layer, the bonding layer being configured to plastically deform but not melt to bumplessly bond to one of the second group of plural conductor pads of the second semiconductor chip; and
   the first glass layer being configured to bond to a second glass layer of the second semiconductor chip.

2. The apparatus of claim 1, wherein each of the first groups comprises a main conductor pad and plural dummy pads circumferentially arranged around the main conductor pad.

3. The apparatus of claim 1, comprising the second semiconductor chip mounted on the first semiconductor chip and electrically connected thereto by the plurality of interconnects.

4. An apparatus, comprising:
   a first semiconductor chip having a first glass layer and plural first conductor pads in the first glass layer, each of the plural first conductor pads including a bottommost base layer and a bonding layer on the bottommost base layer, the bottommost base layer having a greater coefficient of thermal expansion than the bonding layer, the bonding layer being configured to plastically deform but not melt to bumplessly bond to a conductor pad of another semiconductor chip; and
   the first glass layer being configured to bond to a second glass layer of the second semiconductor chip.

5. The apparatus of claim 4, comprising a barrier layer between the bottommost base layer and the bonding layer.

6. The apparatus of claim 5, wherein the bottommost base layer comprises aluminum and the bonding layer comprises copper or nickel.

7. The apparatus of claim 4, comprising the second semiconductor chip mounted on the first semiconductor chip and electrically connected thereto by the plurality of conductor pads of the first semiconductor chip.

8. A method of manufacturing, comprising:
   fabricating plural first groups of plural conductor pads in a first glass layer of a first semiconductor chip, each of the plural first groups of conductor pads including a main conductor pad and one or more dummy pads adjacent the main conductor pad and being configured to bumplessly connect to a corresponding second group of plural conductor pads of a second semiconductor chip to make up a first interconnect of a plurality of interconnects that connect the first semiconductor chip to the second semiconductor chip, each of the main conductor pads including a bottommost base layer and a bonding layer, the bottommost base layer having a greater coefficient of thermal expansion than the bonding layer, the bonding layer being configured to plastically deform but not melt to bumplessly bond to one of the second group of plural conductor pads of the second semiconductor chip; and
   the first glass layer being configured to bond to a second glass layer of the second semiconductor chip.

9. The method of claim 8, wherein each of the first groups comprises a main conductor pad and plural dummy pads circumferentially arranged around the main conductor pad.

10. The method of claim 8, comprising mounting the second semiconductor chip on the first semiconductor chip and electrically connecting the first semiconductor chip to the second semiconductor chip with the plurality of interconnects.

11. The method of claim 10, wherein the electrically connecting the first semiconductor chip to the second semiconductor chip with the plurality of interconnects comprises annealing to bond the first glass layer to the second glass layer and cause the plural first groups of conductor pads and the plural second groups of conductor pads to plastically deform and bond together.

12. A method of manufacturing, comprising:
fabricating plural first conductor pads in a first glass layer of a first semiconductor chip, each of the plural first conductor pads including a bottommost base layer and a bonding layer on the bottommost base layer, the bottommost base layer having a greater coefficient of thermal expansion than the bonding layer, the bonding layer being configured to plastically deform but not melt to bumplessly bond to a conductor pad of another semiconductor chip; and
the first glass layer being configured to bond to a second glass layer of the second semiconductor chip.

13. The method of claim 12, comprising forming a barrier layer between the bottommost base layer and the bonding layer.

14. The method of claim 13, wherein the bottommost base layer comprises aluminum and the bonding layer comprises copper or nickel.

15. The method of claim 12, comprising mounting the second semiconductor chip on the first semiconductor chip and electrically connecting the first semiconductor chip to the second semiconductor chip with the plural first conductor pads of the first semiconductor chip and plural second conductor pads of the second semiconductor chip.

16. The method of claim 15, wherein the electrically connecting the first semiconductor chip to the second semiconductor chip with the plural first conductor pads comprises annealing to bond the first glass layer to the second glass layer and cause the plural first conductor pads and the plural second conductor pads to plastically deform and bond together.

* * * * *